(12) United States Patent
Zhu et al.

(10) Patent No.: US 10,580,361 B2
(45) Date of Patent: Mar. 3, 2020

(54) ORGANIC LIGHT-EMITTING DISPLAY PANEL AND ORGANIC LIGHT-EMITTING DISPLAY DEVICE

(71) Applicant: Shanghai Tianma AM-OLED Co., Ltd., Shanghai (CN)

(72) Inventors: Renyuan Zhu, Shanghai (CN); Yue Li, Shanghai (CN); Dongxu Xiang, Shanghai (CN); Yana Gao, Shanghai (CN); Xingyao Zhou, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/980,073

(22) Filed: May 15, 2018

(65) Prior Publication Data

US 2018/0261164 A1    Sep. 13, 2018

(30) Foreign Application Priority Data

Nov. 28, 2017   (CN) .......................... 2017 1 1217866

(51) Int. Cl.
    *G09G 3/30*        (2006.01)
    *G09G 3/3266*      (2016.01)
    *G09G 3/3225*      (2016.01)
    *G11C 19/28*       (2006.01)

(52) U.S. Cl.
    CPC ......... *G09G 3/3266* (2013.01); *G09G 3/3225* (2013.01); *G11C 19/287* (2013.01); *G09G 2310/0286* (2013.01); *G09G 2310/06* (2013.01); *G09G 2310/08* (2013.01)

(58) Field of Classification Search
    CPC .................................................... G09G 3/3266
    See application file for complete search history.

(56) References Cited

U.S. PATENT DOCUMENTS

2012/0105396 A1*  5/2012  Sakamoto ............ G09G 3/3677
                                                    345/204
2012/0105423 A1*  5/2012  Chung ................. G09G 3/3266
                                                    345/212
2018/0197481 A1*  7/2018  Choi .................... G09G 3/3266

FOREIGN PATENT DOCUMENTS

CN      103050106 A      4/2013
CN      105185339 A     12/2015
CN      105244005 A      1/2016

* cited by examiner

*Primary Examiner* — Roy P Rabindranath
(74) *Attorney, Agent, or Firm* — Alston & Bird LLP

(57) ABSTRACT

Provided are an organic light-emitting display panel and an organic display device, the organic light-emitting display panel includes: a display region and at least one peripheral circuit region; the peripheral circuit region is provided with shift registers cascaded in stages and clock signal lines of at least two different types, the number of clock signal lines in at least one of the different types is not less than 2, clock signals of one type of the clock signal lines are the same, clock signals of different types of the clock signal lines are different; the clock signal lines each is electrically connected to a clock signal input terminal of one of the shift registers, the shift registers each is configured to output a gate driving signal according to the clock signal in the clock signal line electrically connected to the input terminal of one of the shift registers.

11 Claims, 10 Drawing Sheets

ORGANIC LIGHT-EMITTING DISPLAY PANEL AND ORGANIC LIGHT-EMITTING DISPLAY DEVICE

CROSS-REFERENCE TO RELATED APPLICATIONS

This application claims priority to a Chinese patent application No. CN 201711217866.8 filed on Nov. 28, 2017, the disclosure of which is incorporated herein by reference in its entirety.

TECHNICAL FIELD

The present disclosure relates to display technologies, and in particular relates to an organic light-emitting display panel and an organic light-emitting display device.

BACKGROUND

Organic light-emitting display panels are widely applied in display industry because of its advantages such as fast responses, slim designs, wide operating ranges. An organic light-emitting display panel typically includes a gate driving circuit, a source driving circuit and a pixel array. The gate driving circuit is configured to successively turn on row pixels of the pixel array, the source driving circuit is configured to output a data signal to a corresponding pixel, and thus a display function of the organic light-emitting display panel is achieved.

The gate driving circuit is commonly formed by a plurality of cascaded shift registers, a driving signal output terminal of each stage of shift register corresponds to a respective one of gate signal lines. Clock signals are provided to the shift registers via clock signal lines, the shift register is configured to successively output scanning signals to the corresponding gate signal line along a scanning direction under control of the clock signals transmitted via the clock signal lines. However, as the resolution of an organic light-emitting display device becomes higher and the number of rows of pixels increases, the loads of the clock signal lines increases due to increased number of stages of the shift registers. Therefore, the clock signals in the clock signal lines electrically connected to the shift registers are significantly delayed, and display effect of the organic light-emitting display panel is affected.

SUMMARY

In view of the above, the present disclosure provides an organic light-emitting display panel and an organic light-emitting display device, which reduces the delay of the clock signals in the clock signal lines of the organic light-emitting display panel electrically connected to the shift registers, and the display effect of the organic light-emitting display panel is optimized.

In an aspect, some embodiments of the present disclosure provides an organic light-emitting display panel, including:

a display region and at least one peripheral circuit region outside the display region;

the at least one peripheral circuit region is provided with a plurality of shift registers cascaded in stages and a plurality of clock signal lines of at least two different types, the a number of clock signal lines in at least one of the at least two different types is not less than 2, clock signals of one type of the clock signal lines are the same, and clock signals of different types of the clock signal lines are different.

The clock signal lines each is electrically connected to a clock signal input terminal of one of the shift registers, the shift registers each is configured to output a gate driving signal according to the clock signal in the clock signal line electrically connected to the input terminal of one of the shift registers.

In another aspect, some embodiments of the present disclosure further provides an organic light-emitting display device including the organic light-emitting display panel mentioned in the first aspect.

DETAILED DESCRIPTION

Figure 1:
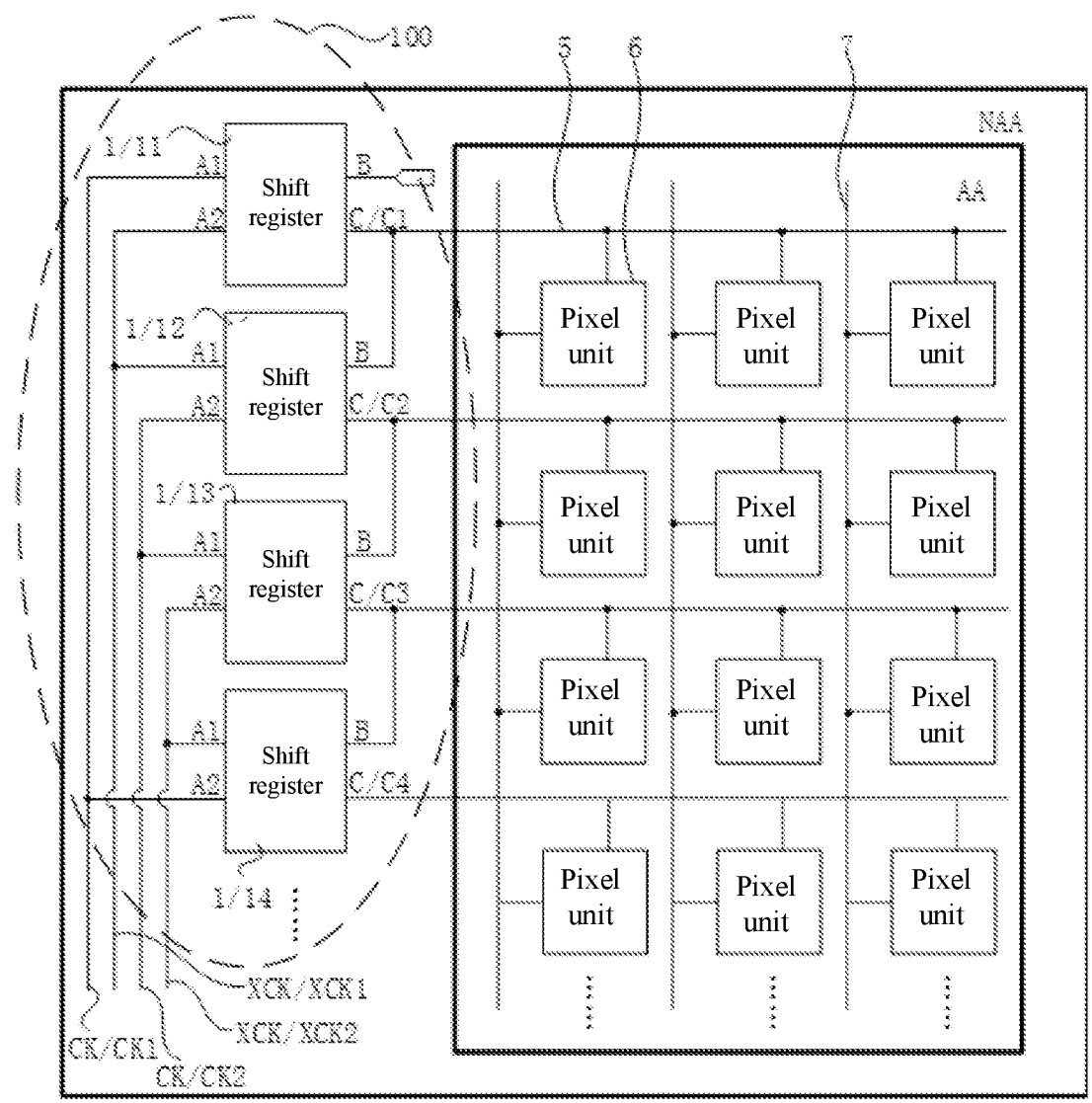
FIG. 1 is a structural diagram showing an organic light-emitting display panel according to an embodiment of the present disclosure.

The present disclosure is further described below in combination with the drawings and embodiments. It should be understood that, the specific embodiments described herein are merely used to explain the present disclosure rather than limiting the present disclosure. In addition, it should be stated that in order to facilitate the description, merely a part of structures related to the present disclosure rather than the whole structure are illustrated in the drawings. Throughout the description, the same or similar numerals denote the same or similar structures, elements and processes. It should be noted that, embodiments and features of the embodiments may be mutually combined under no conflicts.

Some embodiments of the present disclosure provides an organic light-emitting display panel including: a display region and a peripheral circuit region outside the display region; the peripheral circuit region is provided with a plurality of shift registers cascaded and a plurality of clock signal lines of at least two different types, clock signals of one type of the clock signal lines are the same, and clock signals of different types of the clock signal lines are different. Each of the clock signal lines is electrically connected to a clock signal input terminal of a corresponding shift register of the shift registers, the shift register is configured to output a gate driving signal according to the clock signal in the clock signal line electrically connected to the shift register; and the number of at least one type of the clock signal lines is not less than 2.

The organic light-emitting display panel includes a gate driving circuit, a source driving circuit and a pixel array. The gate driving circuit is configured to successively turn on rows of pixels in the pixel array, the source driving circuit is configured to output a data signal to a corresponding pixel, and thus a display function of the organic light-emitting display panel is achieved. The gate driving circuit is commonly formed by a plurality of cascaded shift registers, a driving signal output terminal of each stage of shift register corresponds to a respective one of gate signal lines. The clock signals are provided to the shift registers via the clock signal lines, the shift registers are configured to successively output scanning signals to the corresponding gate signal lines along a scanning direction under control of the clock signals transmitted via the clock signal lines. The higher the definition of the organic light-emitting display panel is, the more the rows of pixels are. The loads of the clock signal lines are increased due to increased number of stages of the shift registers, which leading to a serious delay phenomenon in the shift register, and the display effect of the organic light-emitting display panel is affected.

The organic light-emitting display panel provided in some embodiments of the present disclosure includes: a plurality of clock signal lines of at least two different types, clock signals of one type of the clock signal lines are the same, and clock signals of different types of the clock signal lines are different. By proving the number of at least one type of the clock signal lines to be not less than 2, in contrast with a related art, the number of the clock signal lines electrically connected to shift registers of the organic light-emitting display panel is increased, and the number of the shift registers electrically connected to the same clock signal line is decreased. That is, the loads of the clock signal line are decreased, which reduces the delay of the clock signals in the clock signal lines of the organic light-emitting display panel electrically connected to the shift registers, and the display effect of the organic light-emitting display panel is optimized.

Above contents are principles of the present disclosure, a detailed description on the technical solutions of the present disclosure is clearly and fully given in combination with the drawings of the present disclosure. Based on the embodiments of the present disclosure, other embodiments obtained by those skilled in the art without creative works fall into a scope of protection.

FIG. 1 is a structural diagram showing an organic light-emitting display panel according to an embodiment of the present disclosure. As shown in FIG. 1, the organic light-emitting display panel includes a display region AA and a peripheral circuit region NAA outside the display region AA. The peripheral circuit region NAA is provided with a plurality of cascaded shift registers 1 and a plurality of clock signal lines of at least two different types, clock signals of one type of the clock signal lines are the same, and clock signals of different types of the clock signal lines are different. Each of the clock signal lines is electrically connected to a clock signal input terminal of a corresponding shift register 1 of the shift registers 1, the shift register 1 is configured to output a gate driving signal according to the clock signal in the clock signal line electrically connected to the shift register 1, and the number of at least one type of the clock signal lines is not less than 2.

In one embodiment, the number of each type of the clock signal lines in the organic light-emitting display panel is configured to be not less than 2. In FIG. 1, two types of the clock signal lines disposed in the peripheral circuit region are first clock signal lines CK and second clock signal lines XCK, and both of the number of the first clock signal lines CK and the number of the second clock signal lines XCK are not less than 2. The FIG. 1 exemplarily shows that both of the number of the first clock signal lines CK and the number of the second clock signal lines XCK are equal to 2.

The FIG. 1 exemplarily shows four shift registers cascaded, each of the four shift registers includes a first clock signal terminal A1, a second clock signal terminal A2, a trigger signal input terminal B and a driving signal output terminal C. Except the last stage of shift register 1 (not shown in FIG. 1) of the four shift registers 1, for the rest shift registers, the driving signal output terminal C of each of the rest shift registers is electrically connected to adjacent next stage of shift register. A trigger signal outputted via a trigger signal line (not shown in FIG. 1) is received by the trigger signal input terminal B of a first state of the shift register, and the shift register 1 is configured to output the gate driving signal via the driving signal output terminal C according the first clock signal inputted from the first clock signal terminal A1, the second clock signal inputted from the second clock signal terminal A2 and the trigger signal inputted from the trigger signal input terminal B.

A first clock signal terminal of odd-numbered stage of the shift register is electrically connected to one of the first clock signal lines, and a second clock signal terminal of the odd-numbered stage of the shift register is electrically connected to one of the second clock signal lines; the first clock signal terminal of even-numbered stage of the shift register is electrically connected to one of the second clock signal lines, and the second clock signal terminal of the even-numbered stage of the shift register is electrically connected to one of the first clock signal lines. As shown in FIG. 1, the first clock signal terminals A1 of a first stage of shift register 11 and a second stage of shift register 13 are electrically connected to the first clock signal line CK, and the second clock signal terminals A2 of a first stage of shift register 11 and a second stage of shift register 13 are electrically connected to the second clock signal line XCK. The first clock signal terminals A1 of a second stage of shift register 11 and a fourth stage of shift register 13 are electrically connected to the second clock signal line XCK, and the second clock signal terminals A2 of a second stage of shift register 11 and a fourth stage of shift register 13 are electrically connected to the first clock signal line CK.

The first clock line CK electrically connected to at least one of the shift registers 1 is different from the first clock line CK electrically connected to the rest of the shift registers 1, and the second clock line XCK electrically connected to at least one of the shift registers 1 is different from the second clock line XCK electrically connected to the rest of the shift registers 1. As shown in FIG. 1, exemplarily, the first stage of shift register 11 and the fourth stage of shift register 14 are electrically connected to the first clock signal line CK1, and the second stage of shift register 12 and the third stage of shift register 13 are electrically connected to the first clock signal line CK2. The first stage of shift register 11 and the second stage of shift register 12 are electrically connected to the second clock signal line XCK1, and the third stage of shift register 13 and the fourth stage of shift register 14 are electrically connected to the second clock signal line XCK2. By providing the first clock line CK electrically connected to at least one of the shift registers 1 to be different from the first clock line CK electrically connected to the rest of the shift registers 1, the second clock line XCK electrically connected to at least one of the shift registers 1 different from the second clock line XCK electrically connected to the rest of the shift registers 1, which guarantees that all of the shift registers 1 are not electrically connected to the same first clock signal line CK or the same second clock signal line XCK. In contrast with conventional technology, the number of the shift registers electrically connected to the first clock signal line CK alone or the second clock signal line XCK alone is decreased. That is, the load of the first clock signal line CK and the second clock signal line XCK is decreased, which reduces the delay of the gate driving signal outputted from the driving signal output terminal C caused by the delay of the first clock signal in the first clock signal line CK and the second clock signal in the second clock signal line XCK, and the display effect of the organic light-emitting display panel is affected.

Figure 2:
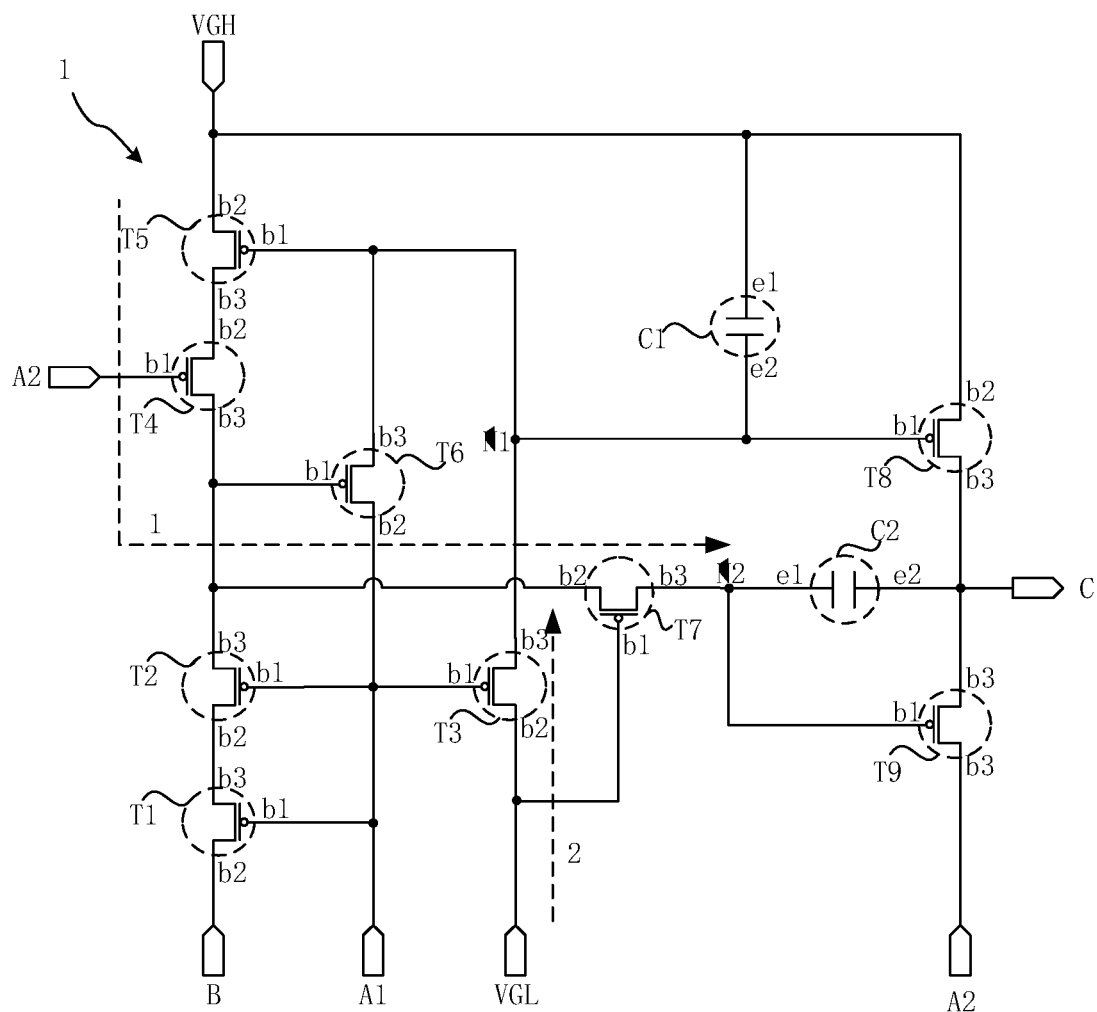
FIG. 2 is a structural diagram showing a specific circuit of a shift register according to an embodiment of the present disclosure.

FIG. 2 is a specific circuit diagram showing a shift register according to an embodiment of the present disclosure. Combining FIG. 1 and FIG. 2, each stage of the shift register 1 includes a first transistor T1, a second transistor T2, a third transistor T3, a fourth transistor T4, a fifth transistor T5, a sixth transistor T6, a seventh transistor T7, an eighth transistor T8, a ninth transistor T9, a first capacitor C1 and a second capacitor C2. A gate electrode b1 of the first transistor T1 is configured as a first clock signal terminal A1 of the shift register 1, a first electrode b2 of the first transistor T1 is configured as a trigger signal inputting terminal B of the shift register 1, and a second electrode b3 of the first transistor T1 is electrically connected to a first electrode b2 of the second transistor T2. A gate electrode b1 of the second transistor T2 is electrically connected to the gate electrode b1 of the first transistor T1, and a second electrode b3 of the second transistor T2 is electrically connected to a second electrode b3 of the fourth transistor T4. A gate electrode b1 of the third transistor T3 is electrically connected to the gate electrode b1 of the second transistor T2, and a first electrode b2 of the third transistor T3 is electrically connected to a second power signal terminal VGL, a second electrode b3 of the third transistor T3 is electrically connected to a first node N1. A gate electrode b1 of the fourth transistor T4 is configured as a second clock signal terminal A2 of the shift register 1, a first electrode b2 of the fourth transistor T4 is electrically connected to a second electrode b3 of the fifth transistor T5. A gate electrode b1 of the fifth transistor T5 is electrically connected to the first node N1, and a first electrode b2 of the fifth transistor T5 is electrically connected to a first power signal terminal VGH. A gate electrode b1 of the sixth transistor T6 is electrically connected to the second electrode b3 of the fourth transistor T4, a first electrode b2 of the sixth transistor T6 is electrically connected to the gate electrode b1 of the second transistor T2, and a second electrode b3 of the sixth transistor T6 is electrically connected to the first node N1. A gate electrode b1 of the seventh transistor T7 is electrically connected to the first electrode b2 of the third transistor T3, a first electrode b2 of the seventh transistor T7 is electrically connected to the second electrode b3 of the second transistor T2, and a second electrode b3 of the seventh transistor T7 is electrically connected to a second node N2. A gate electrode b1 of the eighth transistor T8 is electrically connected to the first node N1, a first electrode b2 of the eighth transistor T8 is electrically connected to the first electrode b2 of the fifth transistor T5, and a second electrode b3 of the eighth transistor T8 is configured as a driving signal outputting terminal C of the shift register 1. A gate electrode b1 of the ninth transistor T9 is electrically connected to the second node N2, a first electrode b2 of the ninth transistor T9 is electrically connected to the gate electrode b1 of the fourth transistor T4, and a second electrode b3 of the ninth transistor T9 is electrically connected to the second electrode N2 of the eighth transistor T8. A first electrode e1 of the first capacitor C1 is electrically connected to the first electrode b2 of the fifth transistor T5, and a second electrode e2 of the first capacitor C1 is electrically connected to the gate electrode b1 of the eighth transistor T8. A first electrode e1 of the second capacitor C2 is electrically connected to the second node N2, and a second electrode e2 of the second capacitor C2 is electrically connected to the second electrode b3 of the ninth transistor T9.

Figure 3:
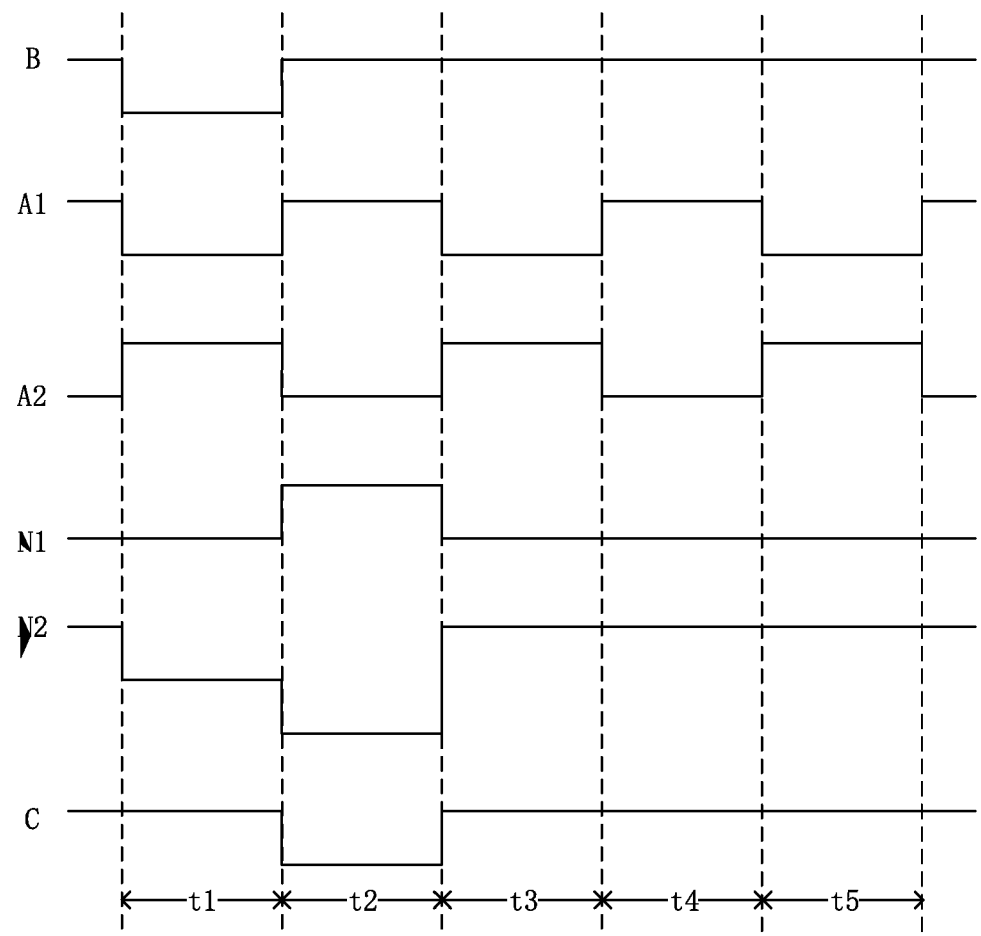
FIG. 3 is a driving timing graph of a shift register according to an embodiment of the present disclosure.

FIG. 3 is a driving timing graph of a shift register according to an embodiment of the present disclosure. Exemplarily, the first transistor T1 to the ninth transistor T9 may be configured as P-type transistors, the first transistor T1 to the ninth transistor T9 may also be configured as N-type transistors, and no limitations are made in embodiments of the present disclosure. In combination with FIG. 2 and FIG. 3, a detailed description about the working principle of the shift register 1 of the organic light-emitting display panel is given as follows.

In a time period t1, the fourth transistor T4 is turned off, and the first transistor T1 to the third transistor T3 and the fifth transistor T5 to the ninth transistor T9 are turned on. Since the trigger signal inputted from the trigger signal input terminal B and the first clock signal inputted from the first clock signal terminal A1 are at low level, the electric potential of the first node N1 and the second node N2 are pulled down, and the driving signal output terminal C of the shift register 1 is configured to output the gate driving signal with logic high level under the control of the second clock signal inputted from the second clock signal terminal A2 and a first power signal inputted from the first power signal terminal VGH.

In a time period t2, the first transistor T1 to the third transistor T3, the fifth transistor T5 and the eighth transistor T8 are turned off, and the fourth transistor T4, the sixth transistor T6, the seventh transistor T7 and the ninth transistor T9 are turned on. Since the first clock signal inputted from the first clock signal terminal A1 is at high level, the electric potential of the first node N1 is pulled up. Under the effect of the second capacitor C2, the second node N2 still maintains a logic low level. Since the ninth transistor T9 is turned on, the electric potential of the second node N2 is further pulled down, and the driving signal output terminal C of the shift register 1 is configured to output the gate driving signal with logic low level under the control of the second clock signal inputted from the second clock signal terminal A2.

In a time period t3, the fourth transistor T4 and the ninth transistor T9 are turned off, and the first transistor T1 to the third transistor T3 and the fifth transistor T5 to the eighth transistor T8 are turned on. Since the first clock signal inputted from the first clock signal input terminal A1 is at low level, the electric potential of the first node N1 is pulled down. As the trigger signal inputted from the trigger signal input terminal B is at low level, the electric potential of the first node N2 is pulled up, and the driving signal output terminal C of the shift register 1 is configured to output the gate driving signal with logic high level under the control of the first power signal inputted from the first power signal terminal VGH.

In a time period t4, the first transistor T1 to the third transistor T3, the sixth transistor T6 and the ninth transistor T9 are turned off, and the fourth transistor T4, the fifth transistor T5, the seventh transistor T7 and the eighth transistor T8 are turned on. Under the effect of the first capacitor C1, the first node N1 still maintains a logic low level, and the electric potential of the second node N2 is pulled up via a path 1. The driving signal output terminal C of the shift register 1 is configured to output the gate driving signal with logic high level under the control of the first power signal inputted from the first power signal terminal VGH.

In a time period t5, the fourth transistor T4, the sixth transistor T6 and the ninth transistor T9 are turned off, and the first transistor T1 to the third transistor T3, the seventh transistor T7, the fifth transistor T5, the seventh transistor T7 and the eighth transistor T8 are turned on. The first node N1 maintains at low level via a path 2, and the driving signal output terminal C of the shift register 1 is configured to output the gate driving signal with logic high level under the control of the first power signal inputted from the first power signal terminal VGH.

Then, the shift register 1 repeats the operations in the time period t4 and the time period t5 until the trigger signal input terminal B of the shift register 1 is changed to low level again.

Figure 4:
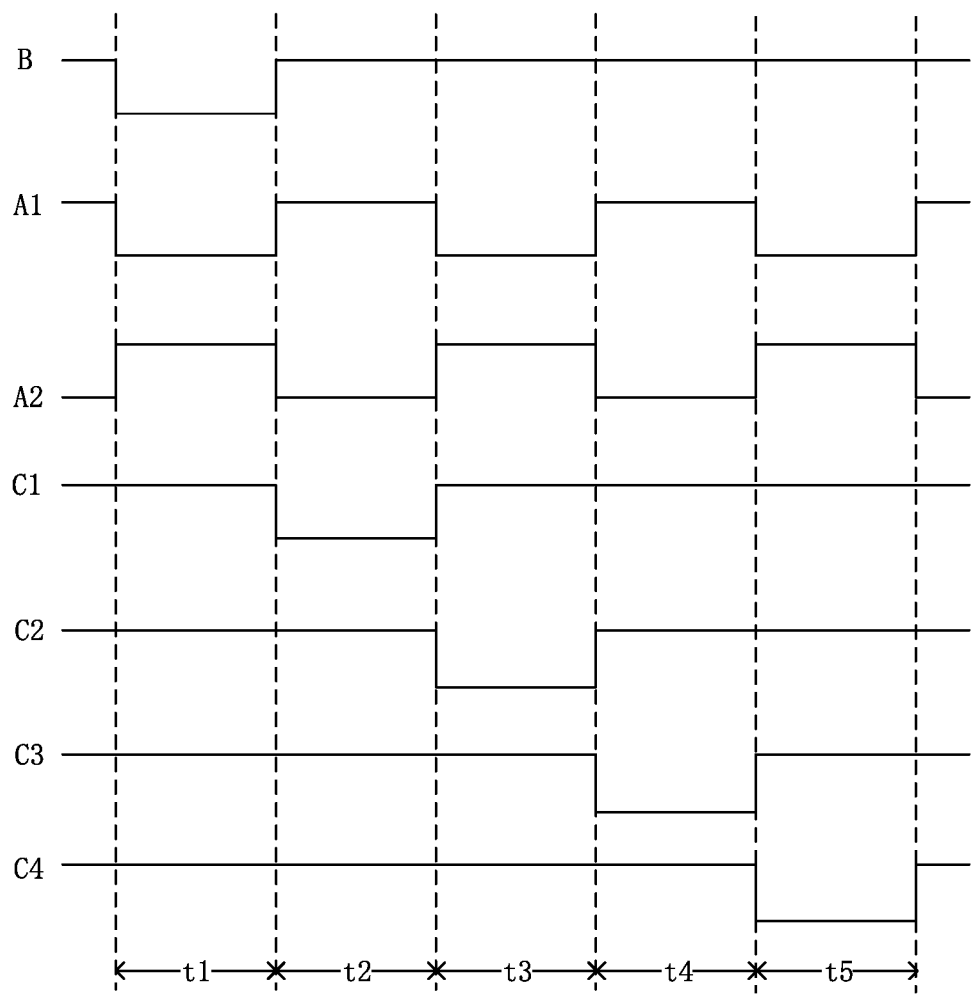
FIG. 4 is a driving timing graph of a shift register according to an embodiment of the present disclosure.

In combination of FIG. 1, FIG. 2 and FIG. 3, since a driving signal output terminal C of each stage of shift register 1 of the shift registers cascaded is electrically connected to a trigger signal input terminal B of a next stage of shift register 1. Taking a first stage of shift register and a second stage of shift register 12 as an example, a trigger signal input terminal B of the first stage of shift register 11 receives a trigger signal with logic low level in the time period t1, a driving signal output terminal C of the first stage of shift register 11 outputs a gate driving signal with logic low level in the time period t2, and the gate driving signal outputted from the driving signal output terminal C of the first stage of shift register 11 is transmitted to the trigger signal input terminal B of the second stage of shift register 12. Then, after the gate driving signal with logic low level is received by the trigger signal input terminal B of the second stage of shift register 12, and the driving signal output terminal C of the second stage of shift register 12 outputs a gate driving signal with logic low level in the time period t3. By repeating above process, a shift function of the shift register 1 is achieved, and a driving timing graph of the process is shown in FIG. 4.

When the clock signal in the clock signal line is delayed due to a relatively large load on the clock signal line, the gate driving signal outputted from the driving signal output terminal of the shift register is also delayed due to the delayed clock signal. For example, when the first clock signal in the first clock signal line CK is delayed due to a relatively large amount of loads on the first clock signal line CK, the gate driving signals outputted from the driving signal output terminals C of the shift register 11 to the shift register 14 are also delayed. When a pixel unit in the organic light-emitting display panel is driven to display by employing the gate driving signal generated by the shift register 1, the pixel unit may not be lighted in a preset time, which seriously affects display effect of the organic light-emitting display panel. The present disclosure provides the number of at least one type of the clock signal lines to be not less than 2, in contrast with conventional technology, the loads on each of the clock signal lines are reduced. Therefore, the delay of the clock signal in the clock signal line is reduced, and the affection of the delayed clock signal on the display effect of the organic light-emitting display panel is improved.

Figure 5:
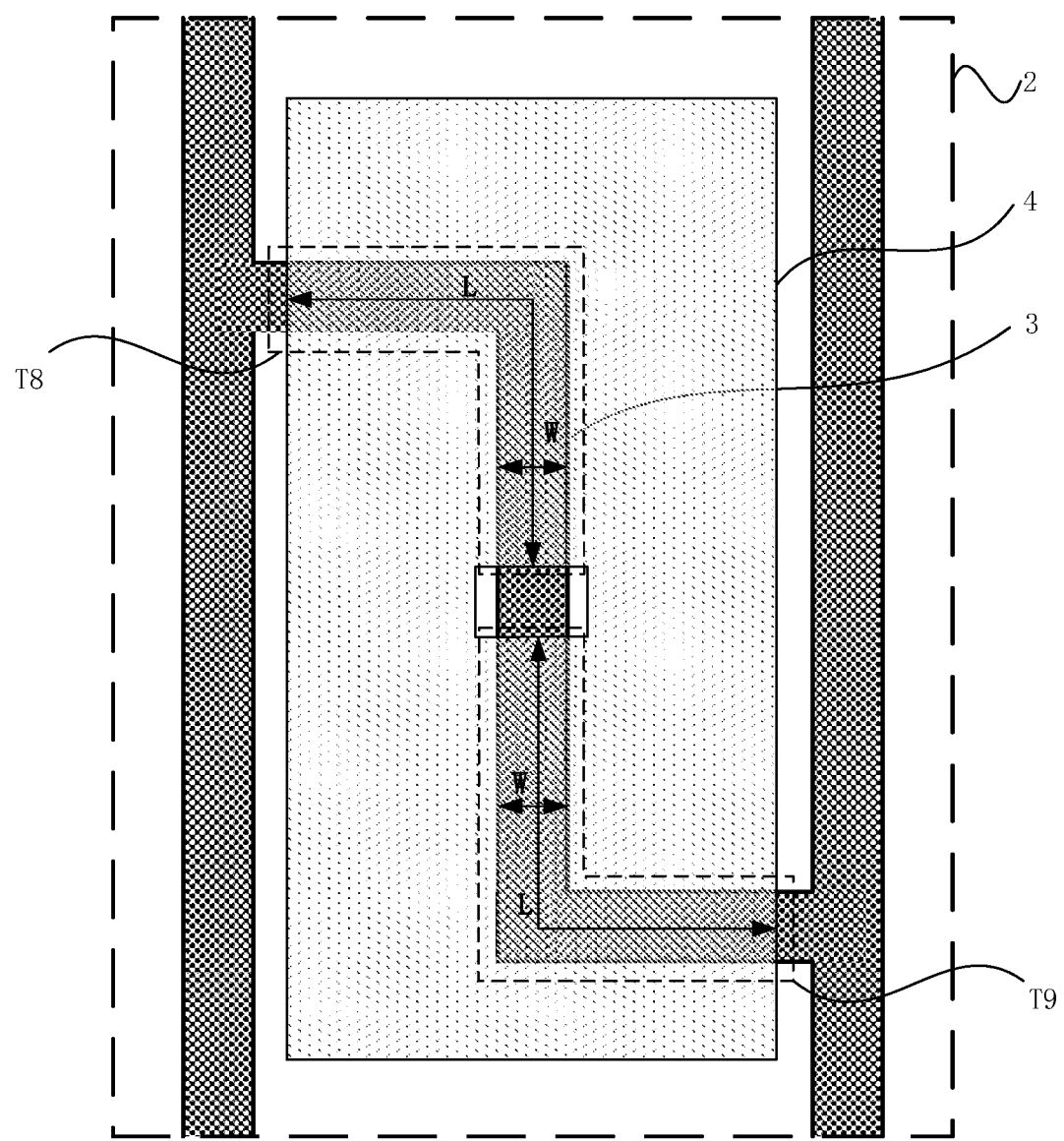
FIG. 5 is a top view of an eighth transistor and a ninth transistor according to an embodiment of the present disclosure.

In one embodiment, a width-to-length ratio of a channel of the eighth transistor T8 is equal to or greater than 5 and equal to or less than 30, and a width-to-length ratio of a channel of the ninth transistor T9 is equal to or greater than 10 and equal to or less than 90. FIG. 5 is a top view showing an eighth transistor and a ninth transistor according to an embodiment of the present disclosure. As shown in FIG. 5, the organic light-emitting display panel includes a substrate 2, both of the eighth transistor T8 and the ninth transistor T9 include an active layer structure 3, a gate electrode layer 4 and a source-drain electrode layer (not shown in FIG. 5) along a direction away from the substrate 2. The active layer structure 3 includes an region K1 and an region K2, which are overlapped with the gate electrode layer 4. That is, the overlapped region K1 is the channel of the eighth transistor T8, and the overlapped region K2 is the channel of the ninth transistor T9. A channel length L is defined as a length of the channel in the extending direction of the active layer structure 3, and a channel width W is defined as a width of the channel in the direction perpendicular to the extending direction of the active layer structure 3.

In combination with FIG. 2 and FIG. 5, a width-to-length ratio W/L of a channel of the eighth transistor T8 may be configured to be equal to or greater than 5 and equal to or less than 30, a width-to-length ratio W/L of a channel of the ninth transistor T9 may be configured to be equal to or greater than 10 and equal to or less than 90. Since a width-to-length ratio W/L of a transistor is in portion to a driving current generated from the transistor, the driving current outputted from the driving signal output terminal C of the shift register 1 is directly affected by the driving current generated by the eighth transistor T8 and the ninth transistor T9. If the width-to-length ratios W/L of channels of the eighth transistor T8 and the ninth transistor T9 are excessively small, an excessively small driving current generated from the eighth transistor T8 and the ninth transistor T9 is resulted, and the driving capacity of the shift register 1 is decreased. However, if the width-to-length ratio W/L of channels of the eighth transistor T8 and the ninth transistor T9 are excessively large, the size of the eighth transistor T8 and the ninth transistor T9 should be increased. Since the shift register 1 is disposed in the peripheral circuit region of the organic light-emitting display panel, a large space of the peripheral circuit region of the organic light-emitting display panel may be occupied by the shift register 1 due to the excessively large size of the eighth transistor T8 and the ninth transistor T9 in the shift register 1, which is not favorable to achieve the narrow bezel of the organic light-emitting display panel.

In one embodiment, both of the number of the first clock signal lines and the number of the second clock signal lines may be set to 2, a difference between the numbers of the shift registers electrically connected to different first clock signal lines is less than 2, and a difference between the numbers of the shift registers electrically connected to different second clock signal lines is less than 2.

In one embodiment, both of the number of the first clock signal lines and the number of the second clock signal lines may be equal to 2. Since both of the number of the first clock signal lines and the number of the second clock signal lines are guaranteed to be increased, the delay of clock signals in the first clock signal lines and the second clock signal lines are reduced, and display effect of the organic light-emitting display panel is improved. At the same time, the number of increased first clock signal lines and increased second clock signal lines are guaranteed to a minimum. Thus, the wire layout of the first clock signal lines and the second clock signal lines will not occupy too much space of the peripheral circuit region of the organic light-emitting display panel, which is favorable to achieve the narrow bezel of the organic light-emitting display panel.

Exemplarily, when the organic light-emitting display panel includes two first clock signal lines and two second clock signal lines and an even number of shift registers (e.g., the number of shift registers of the organic light-emitting display panel is 2n and n is a positive integer), n shift registers are electrically connected to a first clock signal line, and n shift registers are electrically connected to the other clock signal line, n shift registers are electrically connected to a second clock signal line, and n shift registers are electrically connected to the other second clock signal line. Exemplarily, when the organic light-emitting display panel includes two first clock signal lines and two second clock signal lines and an odd number of shift registers (e.g., the number of shift registers of the organic light-emitting display panel is 2n+1 and n is a positive integer), n shift registers are electrically connected to a first clock signal line, n+1 shift registers are electrically connected to the other first clock signal line, n shift registers are electrically connected to a second clock signal line, and n+1 shift registers are electrically connected to the other second clock signal line. Therefore, the loads on both each of the first clock signal lines and each of the second clock signal lines are balanced, and the delay of the clock signals in the clock signal lines is reduced when the number of the clock signal lines is increased.

Figure 6:
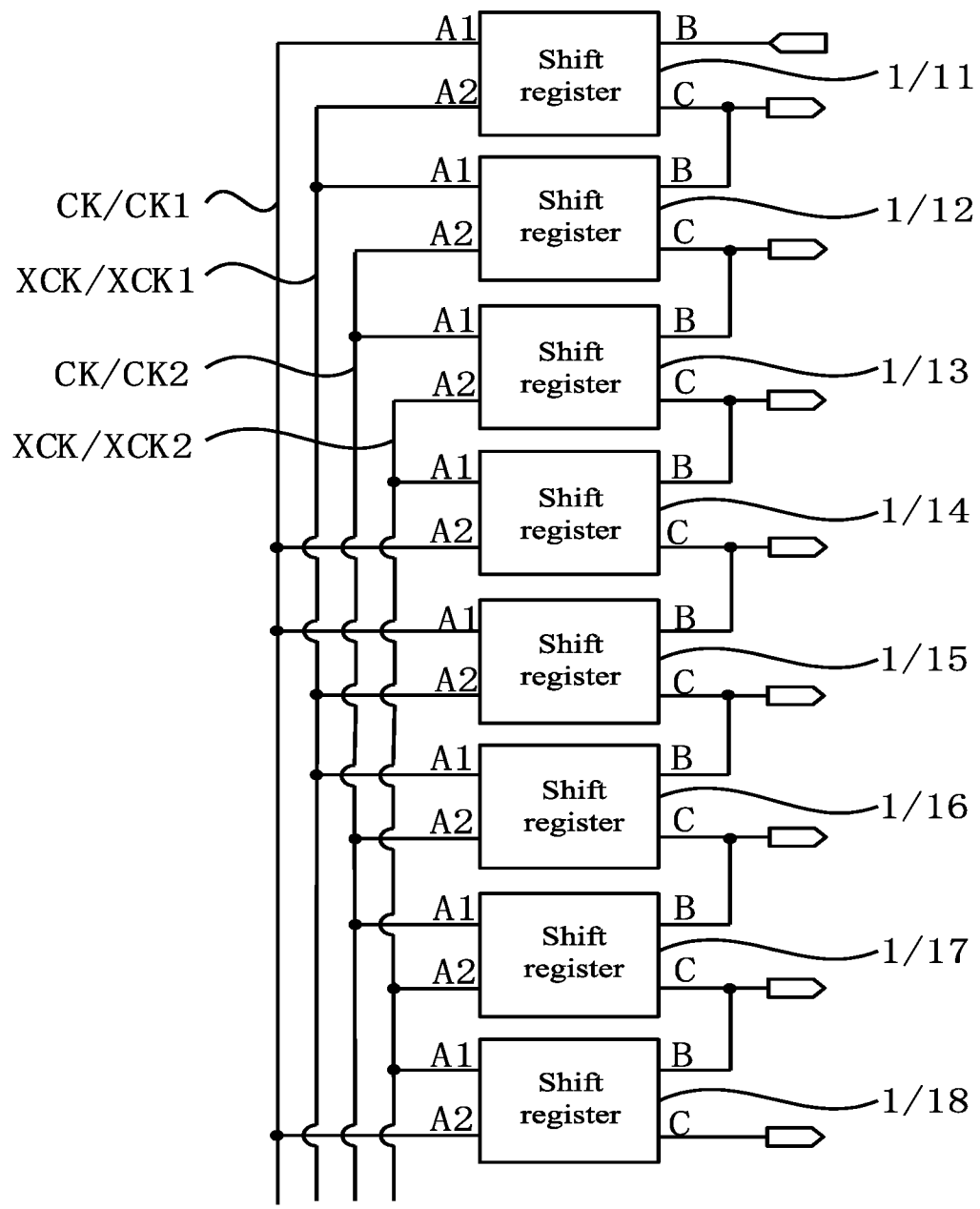
FIG. 6 is a diagram showing connecting relationship of another shift register according to an embodiment of the present disclosure.

In one embodiment, first clock signal input terminals of a (4k+1)-th stage of the shift register are electrically connected to the same first clock signal line, and second clock signal terminals of the (4k+1)-th stage of the shift register are electrically connected to the same second clock signal line, k is an integer equal to or greater than 0. FIG. 6 is a diagram showing the connecting relationship of another shift register according to an embodiment of the present disclosure. As shown in FIG. 6, eight shift registers 1 are exemplarily shown. A first clock signal terminal A1 of a first stage of shift register 11 and a first clock signal terminal A1 of a fifth stage of shift register 15 are configured to electrically connect to the same first clock signal line CK (namely the first clock signal line CK1). A second clock signal terminal A2 of a second stage of shift register 12 and a second clock signal terminal A2 of a fifth stage of shift register 15 are configured to electrically connect to the same second clock signal line XCK (namely the second clock signal line XCK2). Similarly, the first clock signal terminals A1 and the second clock signal terminals A2 of a second stage of shift register to a fourth stage of shift register have same connecting relationships with the first clock signal terminals A1 and the second clock signal terminals A2 of a sixth stage of shift register to an eighth stage of shift register. That is, the connecting relationship between the first clock signal terminals A1 and the second clock signal terminals A2 of every four shift registers 1 and the clock signal lines form a cycle.

As shown in FIG. 1, the organic light-emitting display panel further includes a plurality of gate driving lines 5 and a group of shift registers 100 cascaded. A group of shift registers 1100 cascaded are disposed in the peripheral circuit region NAA which is located at left side of the display region AA. A driving signal output terminal C of the shift register 1 is electrically connected to a respective one of the plurality of gate driving lines 5, and the shift register 1 is configured to output a gate driving signal to the corresponding gate driving line 5 via the driving signal output terminal C. Each stage of shift register 1 is configured to successively output gate driving signals to the gate driving signal line 5 of the organic light-emitting display panel, the gate driving signals are received by pixel units 6 row by row, and then the corresponding pixel unit is turned on. Then, data signals inputted from data signal lines 7 are transmitted to the corresponding pixel unit, and a display function of the organic light-emitting display panel is achieved.

Figure 7:
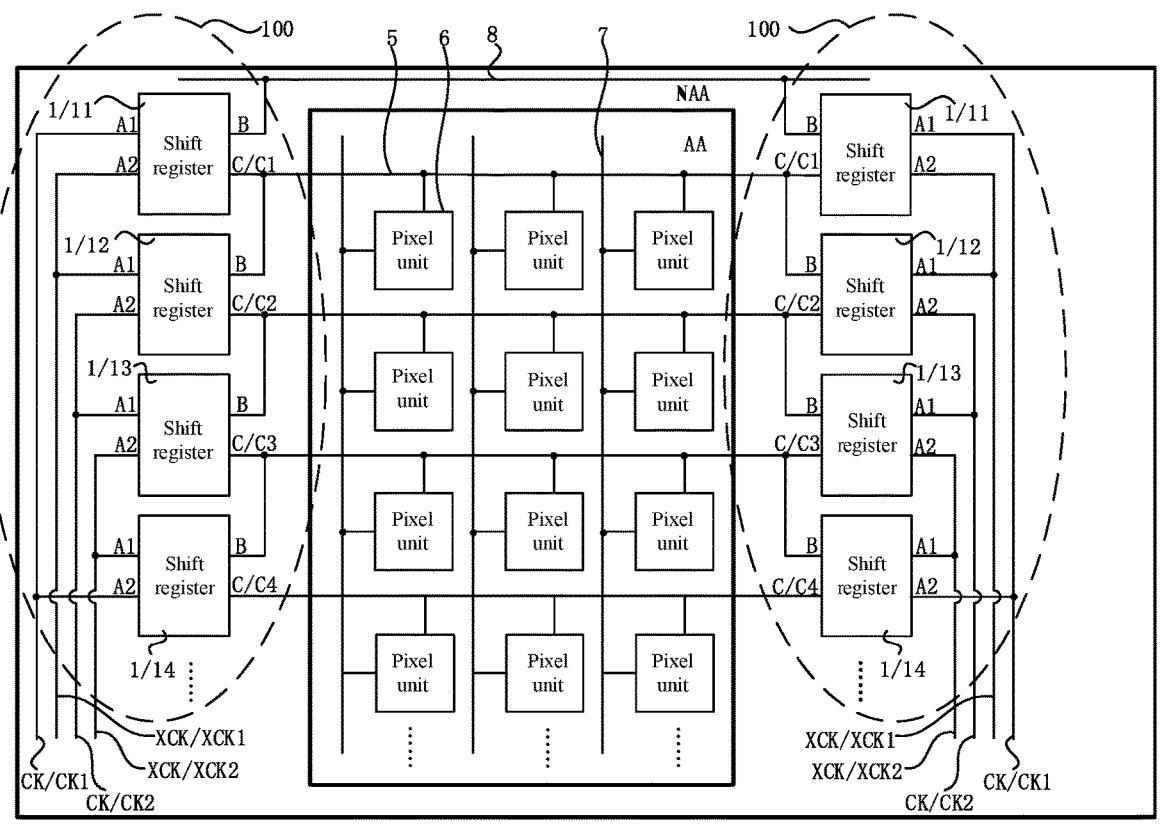
FIG. 7 is a structural diagram showing a schematic circuitry of another organic light-emitting display panel according to an embodiment of the present disclosure.

FIG. 7 is a structural diagram showing a schematic circuitry of another organic light-emitting display panel according to an embodiment of the present disclosure. As shown in FIG. 7, the organic light-emitting display panel circuitry further includes a plurality of gate driving lines 5 and two groups of shift registers 100 cascaded. The two groups of shift registers 100 cascaded are disposed at a respective one of peripheral circuit regions NAA arranged opposite to each other and located at both sides of the display region AA. The signal output terminals C of two shift registers 1 disposed at respective sides are electrically connected together via a same gate driving line 5, and the two shift registers 1 electrically connected to the same gate driving line 5 are configured to synchronously output gate driving signals to the same gate driving line 5 via the driving signal output terminals.

Exemplarily, as shown in FIG. 7, two trigger signal input terminals B of first stages of shift registers 11 in the two groups of shift registers 100 disposed in the peripheral circuit regions located at respective sides are electrically connected to one trigger signal line 8, and the trigger signal line 8 is configured to transmit a trigger signal to the trigger signal input terminals B of first stage of shift register 11 in the two groups of shift registers 100. By providing the signal output terminals C of two shift registers 1 disposed at respective sides are electrically connected together via a same gate driving line 5, and the two shift registers 1 electrically connected to the same gate driving line 5 are configured to synchronously output gate driving signals to the same gate driving line 5 via the driving signal output terminals, which avoids the affection on the display effect of the organic light-emitting display panel caused by a voltage drop in the gate driving line 5.

Figure 8:
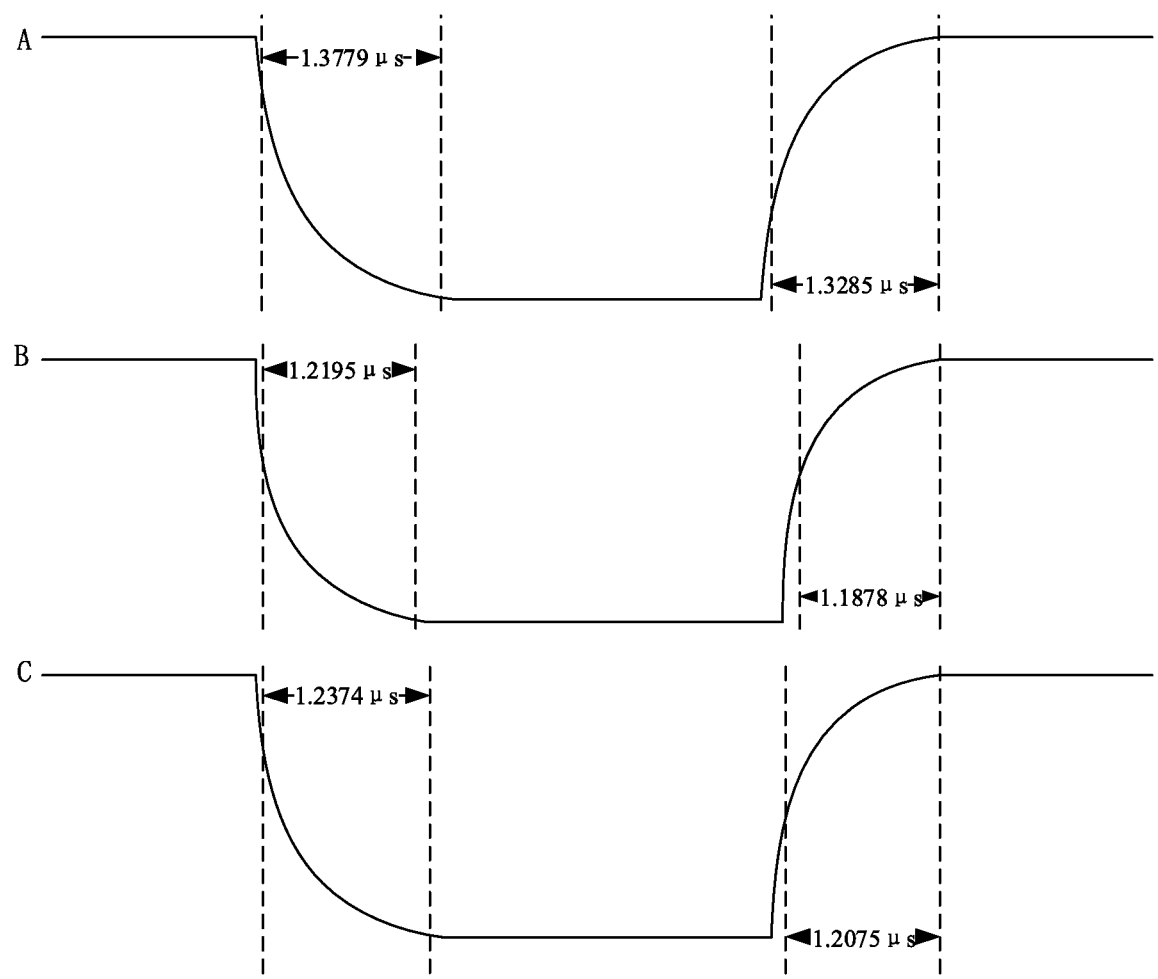
FIG. 8 is a simulation diagram showing a gate driving signal outputted by a shift register according to an embodiment of the present disclosure.

FIG. 8 is a simulation diagram showing a gate driving signal outputted by a shift register according to an embodiment of the present disclosure. In combination with FIG. 1, FIG. 2 and FIG. 8, a exemplary simulation test is operated on the organic light-emitting display panel with a resolution as 1920*1080. In FIG. 8, the simulation graph A is a simulation graph showing a gate driving signal of shift register 1 corresponding to a prior art. The simulation graph B shows that the number of the clock signal lines is increased in order to decrease loads of the clock signal lines, that is, the simulation graph B is a simulation graph showing the gate driving signal of the shift register 1 corresponding to the present disclosure. The simulation graph C is a simulation graph showing the gate driving signal of the shift register 1 corresponding to the case that the width-to-length ratios W/L of channels of the eighth transistor T8 and the ninth transistor T9 are increased so as to improve driving capacity of the shift register 1. L1 is the width of the peripheral circuit region NAA of the organic light-emitting display panel occupied by the increased clock signal lines, L2 is the difference the width of the peripheral circuit region occupied by the eighth transistor T8 and the ninth transistor T9 after increasing its width-to-length ratios W/L of channels and the width of the peripheral circuit region occupied by the eighth transistor T8 and the ninth transistor T9 before increasing its width-to-length ratios W/L of channels, and L1 is equal to L2.

As shown in FIG. 8, for a pulse of the gate driving signal, the duration of trailing edge in the simulation graph A is 1.3779 us, the duration of trailing edge in the simulation graph B is 1.2195 us, and the duration of trailing edge in the simulation graph C is 1.2374 us. In contrast with the simulation graph C, the improvement on the delay time of the trailing edge of the pulse in the simulation graph B is 17.9 ns; the duration of rising edge in the simulation graph A is 1.3285 us, the duration of rising edge in the simulation graph B is 1.1878 us, and the duration of rising edge in the simulation graph C is 1.2075 us. In contrast with the simulation graph C, the improvement on the delay time of the rising edge of the pulse in the simulation graph B is 17.9 ns. That is, in contrast with a prior art and increasing the width-to-length ratios of channels of the eighth transistor T8 and the ninth transistor T9, the present disclosure provides the number of at least one type of the clock signal lines to be not less than 2, thereby improving the affection on the display effect of the organic light-emitting display panel by the delay of the clock signals. At the same time, the increased width of the peripheral circuit of the organic light-emitting display panel is enabled to a minimum.

Figure 9:
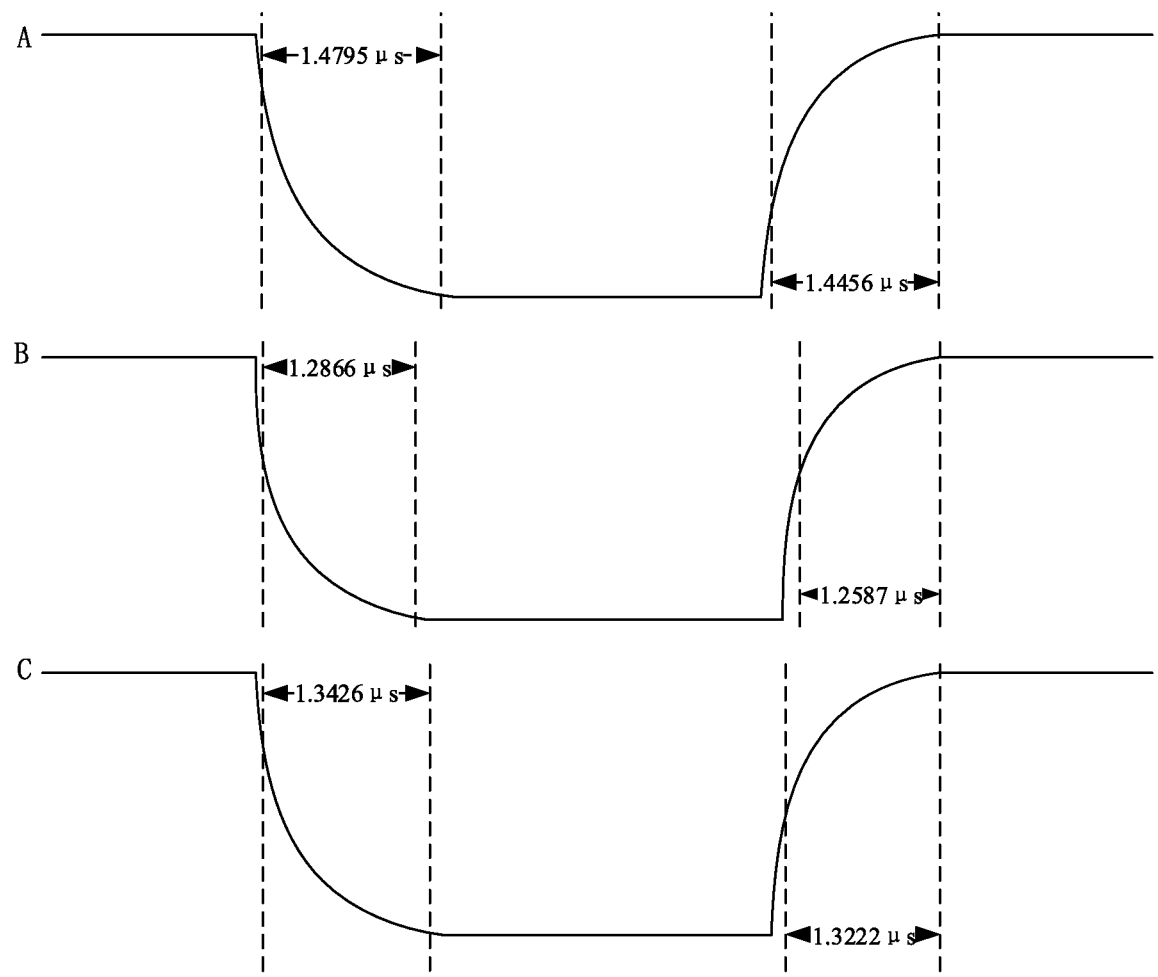
FIG. 9 is a simulation diagram showing a gate driving signal outputted by another shift register according to an embodiment of the present disclosure.

FIG. 9 is a simulation diagram showing a gate driving signal outputted by another shift register according to an embodiment of the present disclosure. In combination with FIG. 1, FIG. 2 and FIG. 9, an exemplary simulation test is operated on the organic light-emitting display panel with a resolution as 2240*1080, the simulation graph A, the simulation graph B and the simulation graph C in FIG. 9 have a same testing condition. As shown in FIG. 9, for a pulse of the gate driving signal, the duration of trailing edge in the simulation graph A is 1.4795 us, the duration of trailing edge in the simulation graph B is 1.2866 us, and the duration of trailing edge in the simulation graph C is 1.3426 us. In contrast with the simulation graph C, the improvement on the delay time of the trailing edge of the pulse in the simulation graph B is 56 ns; the duration of rising edge in the simulation graph A is 1.4456 us, the duration of rising edge in the simulation graph B is 1.2587 us, and the duration of rising edge in the simulation graph C is 1.3222 us. In contrast with the simulation graph C, the improvement on the delay time of the rising edge of the pulse in the simulation graph B is 17.9 ns.

Comparing FIG. 8 with FIG. 9, for the organic light-emitting display panel with a resolution as 1920*1080, the improvements on the delay time of rising edge and trailing edge of the gate driving signal corresponding to the technical solutions employed by the present disclosure are 17.9 ns and 19.7 ns, respectively; for the organic light-emitting display panel with a resolution as 2240*1080, the improvements on the delay time of rising edge and trailing edge of the gate driving signal corresponding to the technical solutions employed by the present disclosure are 56 ns and 63.5 ns, respectively. It should be concluded from above that, for the organic light-emitting display panel with a higher resolution, that is, the more the number of rows of pixel units in the organic light-emitting display panel and the number of gate driving lines are, by proving the number of at least one type of the clock signal lines to be not less than 2, the more the improvements on the affection on the display effect of the organic light-emitting display panel caused by the delay of the clock signals in the clock signal lines are.

It should be noted that, the attached drawings in the present disclosure only exemplarily shows the size of each element instead of practical size of each element in the display panel.

The organic light-emitting display panel provided by the present disclosure includes: a plurality of clock signal lines of at least two different types, clock signals of one type of the clock signal lines are the same, and clock signals of different types of the clock signal lines are different. By proving the number of at least one type of the clock signal lines to be not less than 2, in contrast with a prior art, the number of the clock signal lines electrically connected to shift registers of the organic light-emitting display panel is increased, and the number of the shift registers electrically connected to the same clock signal line is decreased. That is, the loads of the clock signal line is decreased, which improves the delay of the clock signals in the clock signal lines of the organic light-emitting display panel electrically connected to the shift registers 1, and the display effect of the organic light-emitting display panel is optimized.

Figure 10:
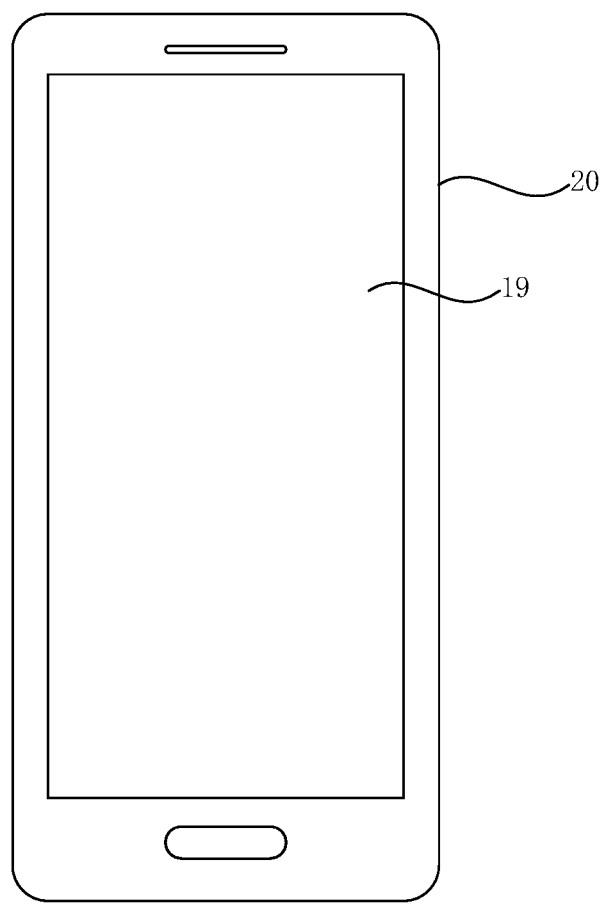
FIG. 10 is a structural diagram showing an organic light-emitting display device according to an embodiment of the present disclosure.

The present disclosure further provides an organic light-emitting display device, and FIG. 10 is a structural diagram showing an organic light-emitting display device according to an embodiment of the present disclosure. As shown in FIG. 10, the organic light-emitting display device 20 includes the organic light-emitting display panel in above embodiments. Therefore, the organic light-emitting display device 20 provided by the present disclosure also have the beneficial effects of above embodiments, and no repetitions are made here. Exemplarily, the organic light-emitting display device 20 may a mobile phone, a computer or an electronic display device.

It should be noted that the above contents are only preferred embodiments of the present disclosure and its technical principles. It can be understood for those skilled in the art that the present disclosure is not limited to specific embodiments described herein. For those skilled in the art, the present disclosure can be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. An organic light-emitting display panel, comprising:
a display region and at least one peripheral circuit region outside the display region;
wherein the at least one peripheral circuit region is provided with a plurality of shift registers cascaded in stages and a plurality of clock signal lines of at least two different types, wherein a number of clock signal lines in at least one of the at least two different types is not less than 2; wherein clock signals of one type of the clock signal lines are the same, and clock signals of different types of the clock signal lines are different;
wherein the plurality of clock signal lines each is electrically connected to a clock signal input terminal of one of the plurality of shift registers; and
wherein the plurality of shift registers each is configured to output a gate driving signal according to the clock signals in multiple of the plurality of clock signal lines electrically connected to clock signal input terminals of one of the shift registers;

wherein the plurality of clock signal lines of at least two different types disposed in the at least one peripheral circuit region are first clock signal lines and second clock signal lines, and both numbers of the first clock signal lines and the second clock signal lines are not less than 2;

wherein a plurality of first clock signal terminals in odd-numbered stages of the shift registers each is electrically connected to one of the first clock signal lines, and a plurality of second clock signal terminals of the odd-numbered stages of the shift registers each is electrically connected to one of the second clock signal lines; wherein a plurality of first clock signal terminals in even-numbered stages of the shift registers each is electrically connected to one of the second clock signal lines, and a plurality of second clock signal terminals in even-numbered stages of the shift registers each is electrically connected to one of the first clock signal lines; and wherein a first clock line electrically connected to at least one of the shift registers is different from a first clock line electrically connected to one of the rest of the shift registers, and a second clock line electrically connected to at least one of the shift registers is different from a second clock line electrically connected to one of the rest of the shift registers;

wherein the plurality of first clock signal terminals in the (4k+1)-th stages of the shift registers are electrically connected to a same one of the first clock signal lines, and the plurality of second clock signal terminals in the (4k+1)-th stages of the shift registers are electrically connected to a same one of the second clock signal lines, wherein k is an integer equal to or greater than 0.

2. The organic light-emitting display panel according to claim 1,
wherein both numbers of the first clock signal lines and the second clock signal lines are equal to 2; and
wherein a difference between the numbers of the shift registers electrically connected to any two different first clock signal lines is less than 2, and a difference between the numbers of the shift registers electrically connected to any two different second clock signal lines is less than 2.

3. The organic light-emitting display panel according to claim 1,
wherein each stage of the shift registers comprises a first transistor, a second transistor, a third transistor, a fourth transistor, a fifth transistor, a sixth transistor, a seventh transistor, an eighth transistor, a ninth transistor, a first capacitor and a second capacitor;
wherein a gate electrode of the first transistor is configured as a first clock signal terminal of the each stage of the shift registers, a first electrode of the first transistor is configured as a trigger signal inputting terminal of the each stage of the shift registers, and a second electrode of the first transistor is electrically connected to a first electrode of the second transistor;
wherein a gate electrode of the second transistor is electrically connected to the gate electrode of the first transistor, and a second electrode of the second transistor is electrically connected to a second electrode of the fourth transistor;
wherein a gate electrode of the third transistor is electrically connected to the gate electrode of the second transistor, and a first electrode of the third transistor is electrically connected to a second power signal terminal, a second electrode of the third transistor is electrically connected to a first node;

wherein a gate electrode of the fourth transistor is configured as a second clock signal terminal of the shift register, a first electrode of the fourth transistor is electrically connected to a second electrode of the fifth transistor;

wherein a gate electrode of the fifth transistor is electrically connected to the first node, and a first electrode of the fifth transistor is electrically connected to a first power signal terminal;

wherein a gate electrode of the sixth transistor is electrically connected to the second electrode of the fourth transistor, a first electrode of the sixth transistor is electrically connected to the gate electrode of the second transistor, and a second electrode of the sixth transistor is electrically connected to the first node;

wherein a gate electrode of the seventh transistor is electrically connected to the first electrode of the third transistor, a first electrode of the seventh transistor is electrically connected to the second electrode of the second transistor, and a second electrode of the seventh transistor is electrically connected to a second node;

wherein a gate electrode of the eighth transistor is electrically connected to the first node, a first electrode of the eighth transistor is electrically connected to the first electrode of the fifth transistor, and a second electrode of the eighth transistor is configured as a driving signal outputting terminal;

wherein a gate electrode of the ninth transistor is electrically connected to the second node, a first electrode of the ninth transistor is electrically connected to the gate electrode of the fourth transistor, and a second electrode of the ninth transistor is electrically connected to the second electrode of the eighth transistor;

wherein a first electrode of the first capacitor is electrically connected to the first electrode of the fifth transistor, and a second electrode of the first capacitor is electrically connected to the gate electrode of the eighth transistor; and wherein a first electrode of the second capacitor is electrically connected to the second node, and a second electrode of the second capacitor is electrically connected to the second electrode of the ninth transistor.

4. The organic light-emitting display panel according to claim 3, wherein a width-to-length ratio of a channel of the eighth transistor is in a range of 5 to 30, and a width-to-length ratio of a channel of the ninth transistor is in a range of 10 to 90.

5. An organic display device, comprising an organic light-emitting display panel, wherein the organic light-emitting display panel comprises:
a display region;
at least one peripheral circuit region outside the display region;
wherein the at least one peripheral circuit region is provided with a plurality of shift registers cascaded in stages and a plurality of clock signal lines of at least two different types, wherein a number of the plurality of clock signal lines in at least one of the at least two different types is not less than 2; wherein clock signals of one type of the plurality of clock signal lines are the same, and clock signals of different types of the plurality of clock signal lines are different;
wherein the plurality of clock signal lines each is electrically connected to a clock signal input terminal of one of the plurality of shift registers; and wherein the plurality of shift registers each is configured to output a gate driving signal according to the clock signals in multiple of the plurality of clock signal lines electrically connected to clock signal input terminals of one of the shift registers;

wherein the organic light-emitting display panel further comprises: a plurality of gate driving lines;

wherein the plurality of shift registers includes two groups of shift registers cascaded in stages, wherein two groups of the shift registers are disposed at two peripheral circuit regions arranged at two opposite sides of the display region; and wherein two signal output terminals of two of the shift registers disposed in the two peripheral circuit regions at opposite side of the display region are electrically connected together via a same one of the gate driving lines, and said two shift registers electrically connected to one of the gate driving lines are configured to synchronously output gate driving signals to said the gate driving line via said signal output terminals of the two shift registers; and wherein the organic light-emitting display panel further comprises a trigger signal line, and a plurality of trigger signal input terminals of a first stage of the shift registers in the two groups of shift registers disposed in the peripheral circuit regions located at said sides of the peripheral circuit regions, wherein the trigger signal line is electrically connected the plurality of trigger signal input terminals, and the trigger signal line is configured to transmit a trigger signal to the plurality of trigger signal input terminals of the first stage of the shift registers.

6. The organic display device according to claim 5, wherein the two types of the plurality of clock signal lines disposed in the at least one peripheral circuit region are first clock signal lines and second clock signal lines, and both numbers of the first clock signal lines and of the second clock signal lines are not less than 2;

wherein a plurality of first clock signal terminals in odd-numbered stages of the shift registers each is electrically connected to one of the first clock signal lines, and a plurality of second clock signal terminals of the odd-numbered stages of the shift registers each is electrically connected to one of the second clock signal lines; wherein a plurality of first clock signal terminals in even-numbered stages of the shift registers each is electrically connected to one of the second clock signal lines, and a plurality of second clock signal terminals in even-numbered stages of the shift registers each is electrically connected to one of the first clock signal lines; and wherein a first clock line electrically connected to at least one of the shift registers is different from a first clock line electrically connected to one of the rest of the shift registers, and a second clock line electrically connected to at least one of the shift registers is different from a second clock line electrically connected to one of the rest of the shift registers.

7. The organic display device according to claim 6, wherein the plurality of first clock signal terminals in the (4k+1)-th stages of the shift registers is electrically connected to a same one of the first clock signal lines, and the plurality of second clock signal terminals in the (4k+1)-th stages of the shift registers are electrically connected to a same one of the second clock signal lines, wherein k is an integer equal to or greater than 0.

8. The organic display device according to claim 6, wherein both numbers of the first clock signal lines and the second clock signal lines are equal to 2; and wherein a difference between the numbers of the shift registers electrically connected to any two different first clock signal lines is less than 2, and a difference between the numbers of the shift registers electrically connected to any two different second clock signal lines is less than 2.

9. The organic display device according to claim 5, wherein wherein each stage of the shift registers comprises a first transistor, a second transistor, a third transistor, a fourth transistor, a fifth transistor, a sixth transistor, a seventh transistor, an eighth transistor, a ninth transistor, a first capacitor and a second capacitor;

wherein a gate electrode of the first transistor is configured as a first clock signal terminal of the each stage of the shift registers, a first electrode of the first transistor is configured as a trigger signal inputting terminal of the each stage of the shift registers, and a second electrode of the first transistor is electrically connected to a first electrode of the second transistor;

wherein a gate electrode of the second transistor is electrically connected to the gate electrode of the first transistor, and a second electrode of the second transistor is electrically connected to a second electrode of the fourth transistor;

wherein a gate electrode of the third transistor is electrically connected to the gate electrode of the second transistor, and a first electrode of the third transistor is electrically connected to a second power signal terminal, a second electrode of the third transistor is electrically connected to a first node;

wherein a gate electrode of the fourth transistor is configured as a second clock signal terminal of the shift register, a first electrode of the fourth transistor is electrically connected to a second electrode of the fifth transistor;

wherein a gate electrode of the fifth transistor is electrically connected to the first node, and a first electrode of the fifth transistor is electrically connected to a first power signal terminal;

wherein a gate electrode of the sixth transistor is electrically connected to the second electrode of the fourth transistor, a first electrode of the sixth transistor is electrically connected to the gate electrode of the second transistor, and a second electrode of the sixth transistor is electrically connected to the first node;

wherein a gate electrode of the seventh transistor is electrically connected to the first electrode of the third transistor, a first electrode of the seventh transistor is electrically connected to the second electrode of the second transistor, and a second electrode of the seventh transistor is electrically connected to a second node;

wherein a gate electrode of the eighth transistor is electrically connected to the first node, a first electrode of the eighth transistor is electrically connected to the first electrode of the fifth transistor, and a second electrode of the eighth transistor is configured as a driving signal outputting terminal;

wherein a gate electrode of the ninth transistor is electrically connected to the second node, a first electrode of the ninth transistor is electrically connected to the gate electrode of the fourth transistor, and a second electrode of the ninth transistor is electrically connected to the second electrode of the eighth transistor;

wherein a first electrode of the first capacitor is electrically connected to the first electrode of the fifth transistor, and a second electrode of the first capacitor is electrically connected to the gate electrode of the eighth transistor; and wherein a first electrode of the second capacitor is electrically connected to the second node, and a second electrode of the second capacitor is electrically connected to the second electrode of the ninth transistor.

10. The organic display device according to claim 9, wherein wherein a width-to-length ratio of a channel of the eighth transistor ranges from 5 to 30, and a width-to-length ratio of a channel of the ninth transistor ranges from 10 to 90.

11. An organic light-emitting display panel, comprising:
a display region;
at least one peripheral circuit region outside the display region; and
a plurality of gate driving lines;
wherein the at least one peripheral circuit region is provided with a plurality of shift registers cascaded in stages and a plurality of clock signal lines of at least two different types, wherein a number of the plurality of clock signal lines in at least one of the at least two different types is not less than 2;
wherein clock signals of one type of the plurality of clock signal lines are the same, and clock signals of different types of the plurality of clock signal lines are different;
wherein the plurality of clock signal lines each is electrically connected to a clock signal input terminal of one of the plurality of shift registers;
wherein the plurality of shift registers each is configured to output a gate driving signal according to the clock signals in multiple of the plurality of clock signal lines electrically connected to clock signal input terminals of one of the shift registers; wherein the plurality of shift registers includes two groups of shift registers cascaded are disposed at two peripheral circuit regions at two opposite sides of the display region;

wherein two signal output terminals of two of the shift registers disposed in the two peripheral circuit regions at opposite sides of the display region are electrically connected together via a same one of the gate driving lines, and the two shift registers electrically connected to one of the gate driving lines are configured to synchronously output gate driving signals to said gate driving line via said signal output terminals of the two shift registers; and wherein the organic light-emitting display panel further comprise a trigger signal line, and a plurality of trigger signal input terminals of a first stage of the shift registers in the two groups of shift registers disposed in the peripheral circuit regions located at opposite sides of the display region; wherein the trigger signal line is electrically connected the plurality of trigger signal input terminals, and the trigger signal line is configured to transmit a trigger signal to the plurality of trigger signal input terminals of the first stage of the shift registers.

* * * * *